(12) United States Patent
David

(10) Patent No.: US 7,864,604 B2
(45) Date of Patent: Jan. 4, 2011

(54) MULTIPLE ADDRESS OUTPUTS FOR PROGRAMMING THE MEMORY REGISTER SET DIFFERENTLY FOR DIFFERENT DRAM DEVICES

(75) Inventor: Howard S. David, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 740 days.

(21) Appl. No.: 11/863,106

(22) Filed: Sep. 27, 2007

(65) Prior Publication Data

US 2009/0085604 A1 Apr. 2, 2009

(51) Int. Cl.
*G11C 7/00* (2006.01)
(52) U.S. Cl. .................. 365/191; 326/30; 365/149; 365/198; 365/233.13
(58) Field of Classification Search ............... 326/30; 365/149, 189.05, 191, 198, 230.08, 233.13
See application file for complete search history.

(56) References Cited

U.S. PATENT DOCUMENTS

| | | | |
|---|---|---|---|
| 6,938,129 B2 | 8/2005 | David | |
| 7,165,153 B2 * | 1/2007 | Vogt | ........................... 711/154 |
| 7,188,208 B2 | 3/2007 | David et al. | |
| 7,269,025 B2 | 9/2007 | David | |
| 7,330,378 B2 * | 2/2008 | Perner et al. | ........... 365/189.011 |
| 7,372,294 B2 * | 5/2008 | Kim | ............................ 326/30 |
| 7,486,104 B2 * | 2/2009 | Oh et al. | ........................ 326/30 |
| 7,716,401 B2 * | 5/2010 | Lee | ............................ 710/100 |
| 2007/0126464 A1 * | 6/2007 | Vergis et al. | ................... 326/30 |

OTHER PUBLICATIONS

Micron "DDR2 (Point-to-Point) Features and Functionality," Technical Note TN-47-19, published 2003. pp. 1-14.*
Micron, "DDR2 Offers New Features and Functionality," Designline, vol. 12, Issue 2, published 2003. pp. 1-16.*

* cited by examiner

*Primary Examiner*—Dang T Nguyen
*Assistant Examiner*—Alexander Sofocleous
(74) *Attorney, Agent, or Firm*—Derek J. Reynolds

(57) ABSTRACT

A method, device, and system are disclosed. In one embodiment, the method includes programming a first On Die Termination (ODT) value into a first plurality of dynamic random access memory (DRAM) devices. The first plurality of DRAM devices are located on a dual inline memory module (DIMM). Additionally, the method also includes programming a second ODT value into a second plurality of additional DRAM devices. The second plurality of additional DRAM devices are also located on the DIMM. The method also specifies that the first and second ODT values are not the same value.

14 Claims, 5 Drawing Sheets

Relative Trace Lengths – AMB to non-ECC

Relative Trace Lengths – AMB to ECC

MULTIPLE ADDRESS OUTPUTS FOR PROGRAMMING THE MEMORY REGISTER SET DIFFERENTLY FOR DIFFERENT DRAM DEVICES

FIELD OF THE INVENTION

The invention relates to programming different values into the mode register or an extended mode register on different Dynamic Random Access Memory (DRAM) devices on the same Dual In-Line Memory Module (DIMM).

BACKGROUND OF THE INVENTION

In many Dual In-line Memory Modules (DIMMs) that have Dynamic Random Access Memory (DRAM) devices coupled to them, there are general signal reflection issues on the data lines. Signal reflection occurs when a signal reaches the end of the signal line it is transmitted across and at least a portion of the signal then reflects back to the origin point. Signal reflection can be mitigated by changing the resistance in the line that transmits the signal. Signal reflection issues are magnified with a DIMM that has more than one memory rank because there is more than one load on each data (DQ) or strobe (DQS) signal. The signal integrity challenges are managed by using resistive termination in the various memory ranks, according to whether read or write cycles are occurring, and which rank is being accessed.

Recently, quad ranked (QR) DIMMs have become popular, which further magnifies the signal reflection issues due to four loads being on the data strobe and data signal lines. Fully Buffered DIMM (FB-DIMM) technology has led to the need for FB-DIMMs with four ranks. There are motivations to having four ranks on a DIMM.

First, in the case of the quad ranked (QR)×8 DIMM, there are four ranks with 9 DRAM in each rank, with a width of 8 bits per DRAM. These DIMMs have a major power advantage over the more traditional 36 device DIMM, the dual ranked (DR)×4, which has two ranks with 18 DRAM in each rank, with a width of 4 bits per DRAM. Since only half as many devices are being accessed on each read or write, the overall power of the QR×8 DIMM can be about 30% less than the equivalent DR×4.

Second, a QR×4 DIMM with 72 DRAM can have twice the capacity of a DR×4 DIMM. Large capacity per DIMM socket is valued by servers.

Third, a QR×4 DIMM built with 72 of the smaller devices (for example, a 1 Gb DRAM) can be much less expensive than a DR×4 or QR×8 DIMM of the same capacity, built with 36 of the larger devices (for example, a 2 Gb DRAM.) This is because the larger device might be 5-10 times more expensive than the smaller device, when the larger device is first available.

The JEDEC Specification for Double Data Rate 2 (DDR2) memory (Revision JESD79-2C, May 2006 by JEDEC Solid State Technology Association) brings the resistive termination on-die (on the DRAM device) and it is stated as On-Die Termination (ODT). By bringing the resistance on-die, the DIMMs are generally more configurable for different resistance values. ODT values are programmed into the Extended Mode Register EMR(1) per DRAM device. But the ODT value, corresponding to the resistance, is programmed by a Advanced Memory Buffer (AMB) device on an FB-DIMM and the AMB programs all ODT values on the DIMM uniformly. The JEDEC DDR2 Specification gives 4 possible values for programmable resistance: disabled, 50Ω, 75Ω, and 150Ω.

The main issue with signal integrity on an QR FB-DIMM with error checking and correction (ECC) is the ECC DRAM device itself. Unlike the non-ECC DRAM devices, the ECC DRAM device is generally located on the DIMM directly behind the AMB on the opposite side of the printed circuit board (substrate). These signal lines are extremely short compared to other DRAM devices and the AMB is located at the physical center of each signal trace, instead of at the end of each trace.

BRIEF DESCRIPTION OF THE DRAWINGS

The present invention is illustrated by way of example and is not limited by the drawings, in which like references indicate similar elements, and in which.

DETAILED DESCRIPTION OF THE INVENTION

Embodiments of a method, device, and system to program a first On-die Termination Value for a non-ECC DRAM on a DIMM and a second On-die Termination Value for an ECC DRAM on the DIMM are described. In the following description, numerous specific details are set forth. However, it is understood that embodiments may be practiced without these specific details. In other instances, well-known elements, specifications, and protocols have not been discussed in detail in order to avoid obscuring the present invention.

Figure 1:
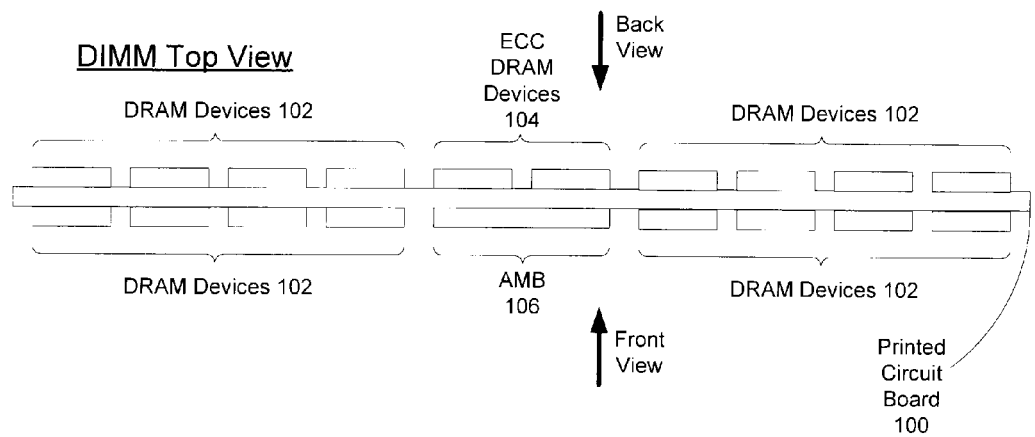
FIG. 1 describes one embodiment of a fully buffered dual inline memory module (FB-DIMM).
Figure 1:
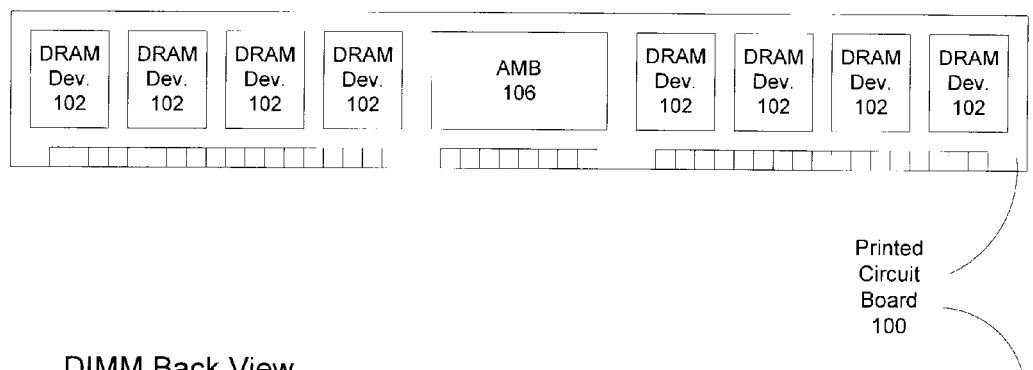
Figure 1:
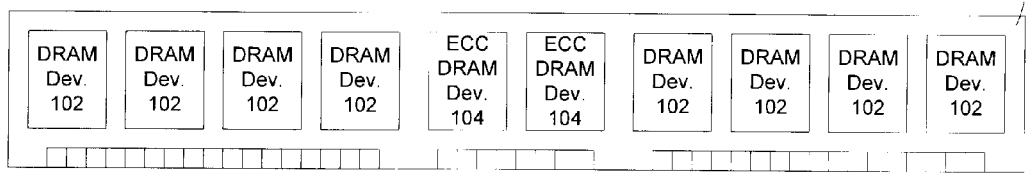

FIG. 1 describes one embodiment of a fully buffered dual inline memory module (FB-DIMM). In many embodiments, the FB-DIMM is a Double Data Rate 2 (DDR2) DIMM. The FB-DIMM includes a printed circuit board 100. The printed circuit board 100 is also commonly referred to as a substrate. A number of Dynamic Random Access Memory (DRAM) devices are coupled to the printed circuit board 100. In many embodiments, multiple Error Checking and Correcting (ECC) DRAM devices 102 and multiple non-ECC DRAM devices 104 are coupled to the substrate. In the embodiment shown in FIG. 1, each ECC DRAM device (or package) and each non-ECC DRAM device coupled to the substrate has two DRAM Silicon dies in the device. The ECC DRAM devices 102 provide for a more robust memory storage medium by determining when errors occur bit-by-bit in the storage locations in the non-ECC DRAM devices 104 and, frequently, ECC can correct the errors. DIMMs that include ECC are quite common, especially in the server market where data integrity is usually of the utmost importance.

On a FB-DIMM an Advanced Memory Buffer (AMB) device 106 is also coupled to the substrate. The AMB 106 provides additional functionality for the DIMM such as providing addresses to memory locations as well as to facilitate the configuration of each DRAM device (102 and 104). In a FB-DIMM configuration, the memory address locations are provided to each DRAM device by the AMB 106, whereas data is transported directly between each DRAM device and a discrete memory controller (discrete from the DIMM). In a memory transaction, each DRAM device potentially only sends/receives a portion of the data (e.g. data bits 0-7, 8-15, etc.). Conversely, each DRAM device receives the entire address.

As mentioned, an important function of the AMB 106 is that it configures each of the DRAM devices by writing a value into the Mode Register (MR) as well as the Extended Mode Registers (EMR 1-3). These four registers are located in each of the DRAM devices (102 and 104) as configuration registers to set up the DRAM devices 102 operating parameters. The methodology for writing data to these registers is to send this information over address lines 15-0. While in a MR set or EMR set (MRS and EMRS respectively) command cycle, the AMB 106 can target one of the four specific registers by sending information on the first two bank address pins (BA1 and BA0). BA1=0 and BA0=0 targets the MR, BA1=0 and BA0=1 targets the EMR(1), BA1=1 and BA0=0 targets the EMR(2), and BA1=1 and BA0=1 targets the EMR(3). Once the particular register is targeted, the address pins A15-A0 send the data to be input into the targeted register.

The embodiment illustrated in FIG. 1 shows a quad-rank (QR) DIMM with 18 dual die parts. The specifics of the dual dies are discussed in greater detail in regard to FIGS. 2 and 3. Though, in other embodiments that are not pictured, the DIMM may be a QR DIMM with 36 single die parts, a quad rank DIMM with 36 dual die parts, a dual-rank DIMM with 36 single die parts, or any other possible DIMM topology that may require multiple on-die termination (ODT) values.

Importantly, as shown in FIG. 1, on an FB-DIMM with ECC, the ECC DRAM devices 102 are generally located on the exact opposite side of the substrate as the AMB 106. This creates much shorter address and data trace lengths from the AMB 106 to these ECC DRAM devices 102 relative to the trace lengths from the AMB 106 to any other non-ECC DRAM device 104 on the substrate.

In other embodiments, the DIMM is a Registered DIMM (RDIMM). In the RDIMM embodiments, a Register device is located in generally the same vicinity on the DIMM as the AMB 106 is on the FB-DIMM. The Register device has similar functionality to the AMB, but without the data going through it. The Register device buffers the addresses and the clocks. Thus, the trace topology on an RDIMM would require similar trace layouts for ECC DRAM devices located on the reverse side of the DIMM substrate.

Figure 2:
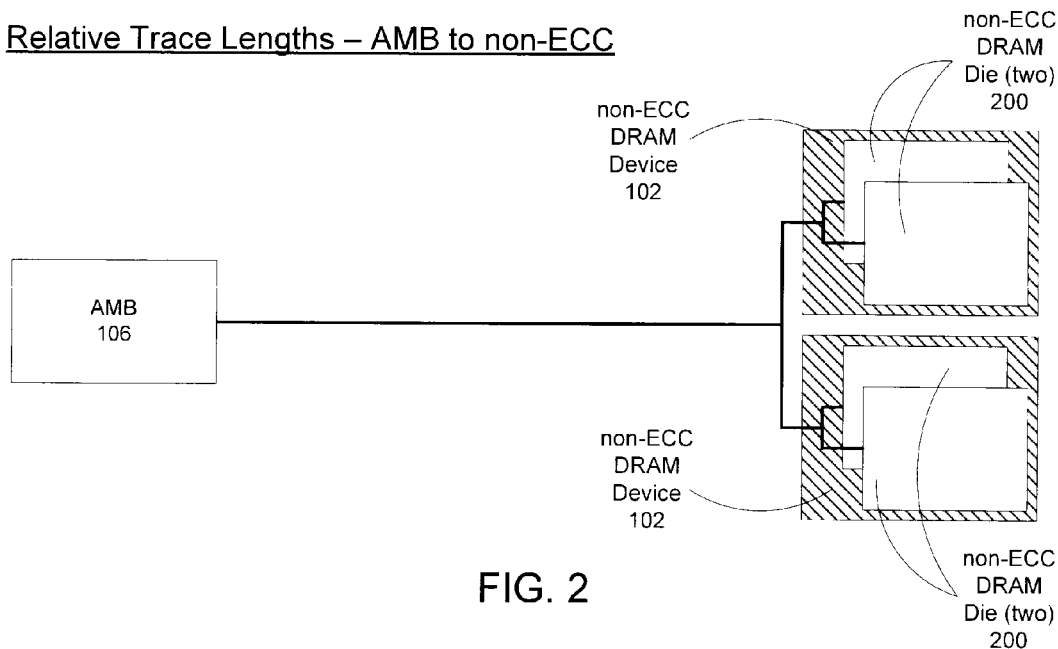
FIG. 2 describes the relative length of the address and data line traces between the Advanced Memory Buffer (AMB) and non-ECC Dynamic Random Access Memory (DRAM) devices on one embodiment of an FB-DIMM.
Figure 3:
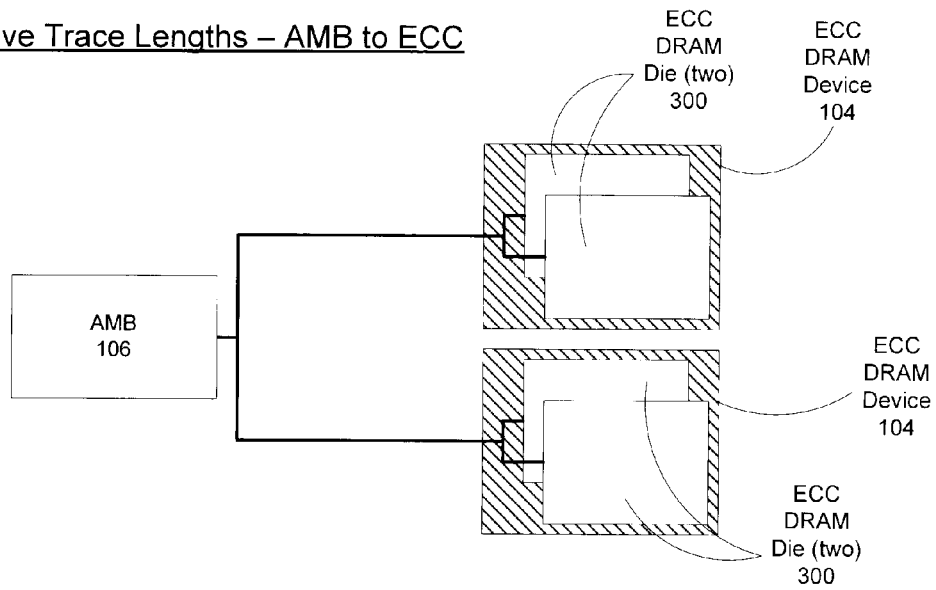
FIG. 3 describes the relative length of the address and data line traces between the AMB and the Error Checking and Correction (ECC) DRAM devices on one embodiment of an FB-DIMM.

Returning to the illustrated FB-DIMM embodiments, FIGS. 2 and 3 describe the relative lengths of address and data line traces between the AMB and the non-ECC DRAM devices and between the AMB and the ECC DRAM devices on one embodiment of an FB-DIMM. FIGS. 2 and 3 also show the relative position of the AMB on the signal trace. Specifically, FIG. 2 illustrates that the AMB is at the end of the signal trace in regard to the non-ECC DRAM devices and FIG. 3 illustrates that the AMB is in the middle of the signal trace in regard to the ECC DRAM devices. An issue that arises with a quad-rank (QR) FB-DIMM that has ECC is that many times the ECC DRAM device 104 is placed directly behind the AMB 106 as mentioned above. Each rank utilizes the ECC DRAM devices 104 to provide error checking and correction for the other DRAM devices in the rank. Again, as mentioned above, the ECC DRAM devices being placed directly behind the AMB refers to the ECC DRAM devices 104 being coupled to the substrate at the location on the direct opposite side of the substrate of the AMB 106.

FIG. 2 illustrates one embodiment of the relative length of a trace from the AMB to a non-ECC DRAM device. More specifically, the trace from the AMB to a non-ECC DRAM device consists of a medium to long trace (potentially 2-7 centimeters (cm) in length) that is split into two very short traces once the trace arrives at a non-ECC DRAM devices, which are located on the front and back of the DIMM. The second split is so the trace can get to each of the two non-ECC DRAM die in the non-ECC DRAM package. The second split is internal to each non-ECC DRAM package. In some cases, the short traces may be less than 1 millimeter (mm) each.

FIG. 3 illustrates one embodiment of the relative length of a trace from the AMB to an ECC DRAM device. AMB to ECC DRAM traces are generally much shorter than their AMB to non-ECC DRAM trace counterparts. Specifically, the trace from the AMB to an ECC DRAM device may be on the order of 1 to 2 cm in total length. Again, this is because the ECC DRAM devices are underneath the AMB. As shown in FIG. 3, the AMB is in the middle of two separate ECC DRAM devices, where only a short trace (e.g. 1-2 cm in length) exists between the AMB and each of these two ECC DRAM devices.

Currently, because the ECC DRAM device utilizes the same ODT values as the other DRAM devices on the DIMM per rank, this can cause significant reflection issues because the amount of signal reflection can also be a product of the length of the trace. With the address and data trace lines from the AMB 106 to the ECC DRAM device 104 so short compared to any other DRAM device, it would be beneficial to have separate ODT values for the ECC DRAM devices than for the other DRAM devices on the DIMM. Thus, having a different ODT value programmed into the EMR(1) for the ECC DRAM devices, as opposed to all other non-ECC DRAM devices on the DIMM would be beneficial to help with reflection issues that are different for the ECC DRAM devices.

Figure 4:
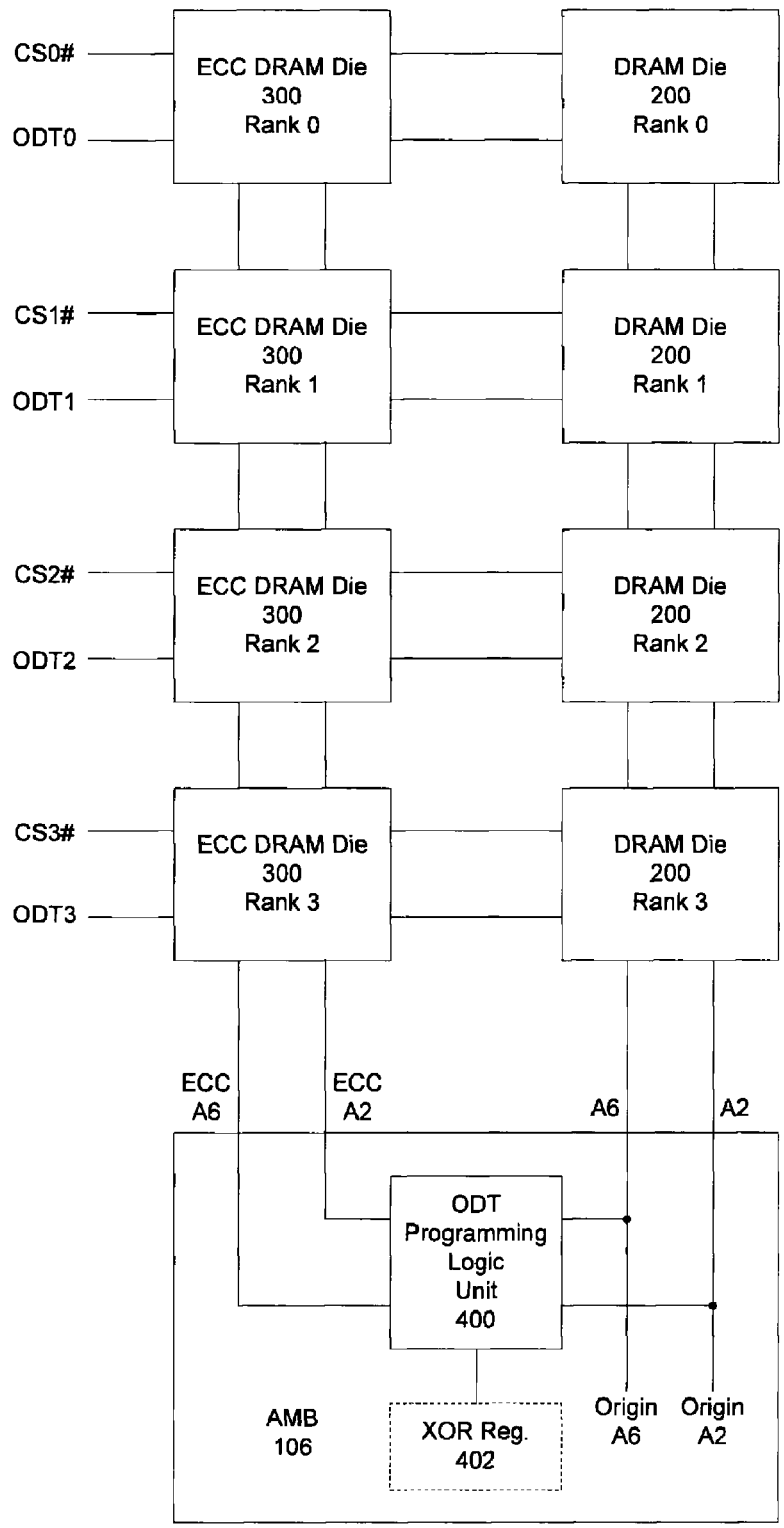
FIG. 4 describes one embodiment of an AMB with On-Die Termination (ODT) programming logic to allow for a different programmed ODT value for the ECC DRAM device than all other DRAM devices on a FB-DIMM.

FIG. 4 describes one embodiment of an AMB with ODT programming logic to allow for a different programmed ODT value for the ECC DRAM device than all other DRAM devices on a FB-DIMM. FIG. 4 shows a QR FB-DIMM, where each rank (ECC and non-ECC devices) receive a unique ODT signal and Chip Select (CS0-3#) signal. The ODT signal per rank (ODT0-3) selects the ODT to be turned on or off to lower power consumption among other things.

The AMB 106 has the general address line outputs A15-A0 that are routed to each of the non-ECC DRAMs on the FB-DIMM, of which address lines A6 and A2 are two of those lines. In many embodiments, the AMB 106 originates the A6 and A2 lines during an EMRS programming mode (Origin A6 and Origin A2). Other logic within the AMB determines the values of these lines. This logic might be firmware, basic input/output system (BIOS) code, or other code or hardware that performs the initial configuration of memory. In many embodiments, an ODT Programming Logic Unit (ODT-PLU) 400 is located within the AMB. The ODT-PLU 400 receives as input the A6 and A2 lines. Depending on the values associated with the A6 and A2 lines, the ODT-PLU 400 may or may not modify the values and send out modified versions (ECC A6 and ECC A2) to the ECC DRAM device in place of the standard A6 and A2 lines, for all ranks.

Figure 5:
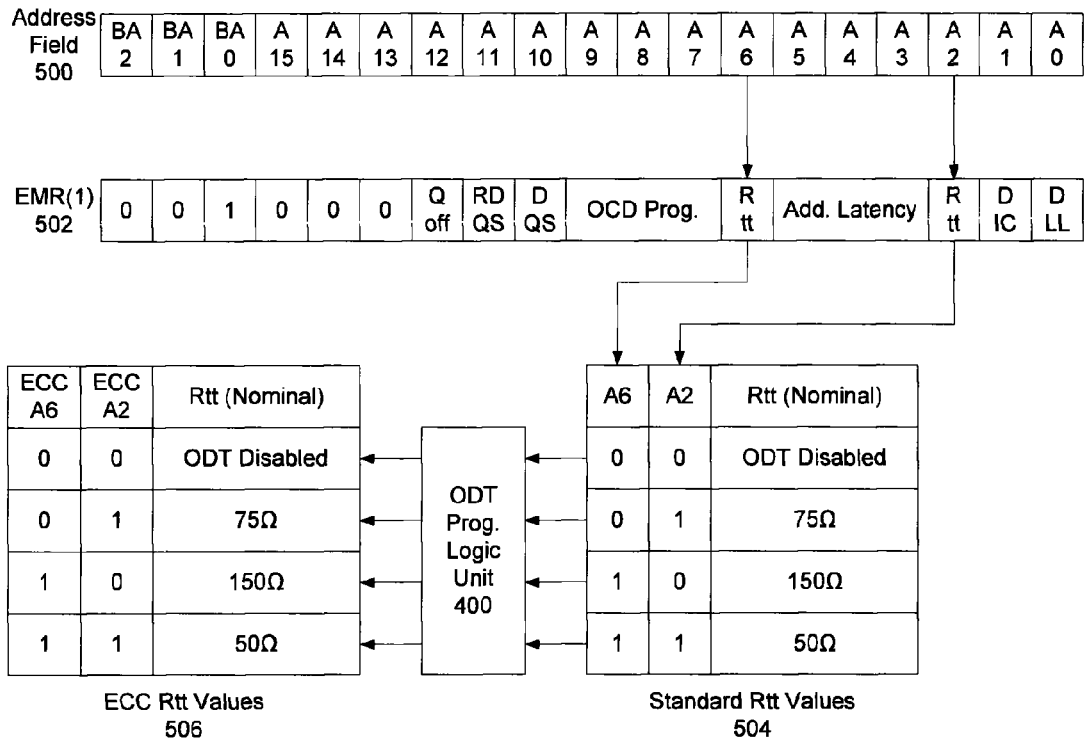
FIG. 5 describes one embodiment of the Extended Mode Register (1) (EMR(1)) values for address lines A6 and A2 and a subsequently ODT-Programming Logic Unit (PLU) modified version of the ECC A6 and ECC A2 values.
Figure 5:
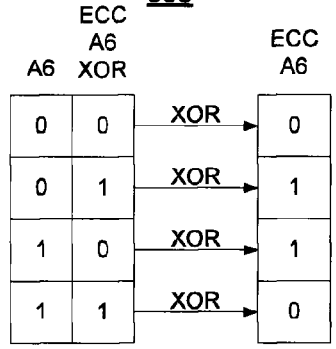
Figure 5:
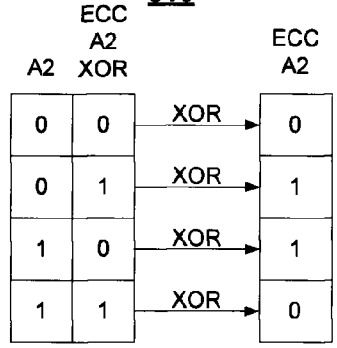

The different potential configurations for ODT values are shown in detail in FIG. 5. In many embodiments, the standard ODT configuration for a QR FB-DIMM is a 150Ω resistance for all DRAM devices including the ECC DRAM device (this corresponds to A6=1 and A2=0). In these embodiments, the ODT-PLU 400 may inverse these values for the ECC DRAM device (ECC A6=0 and ECC A2=1), which corresponds to a 75Ω resistance for the ECC DRAM. Thus, in a standard programmed configuration of a 150Ω resistance for all DRAM devices on the substrate, which can be initiated by a firmware/hardware configuration routine upon system boot, the ODT-PLU 400 can modify the ODT value for the ECC DRAM device separately to a 75Ω resistance. This may be as a result of the initial configuration of the Origin version of A6 and A2. In other embodiments, the ODT-PLU 400 may allow input to manually determine the different resistance of the ECC DRAM device as opposed to all other DRAM devices.

In many embodiments, the ODT-PLU 400 includes logic to generate the ECC A6 and ECC A2 signals from received A6 and A2 signals. In some embodiments, the ECC A6 and ECC A2 signals are generated with the following logic:

ECC_A2=A2 XOR (ECC_A2_XOR AND MRS_CYCLE)
ECC_A6=A6 XOR (ECC_A6_XOR AND MRS_CYCLE)

The outputs of these two logic equations are the generated ECC A2 and ECC A6 values. In many embodiments, a circuit with the above logic outputs the ECC A2 and ECC A6 pins. The inputs of the above logic equations include the following:

A2 is the A2 binary value from an input A2 pin.
A6 is the A6 binary value from an input A6 pin.
ECC_A2_XOR and ECC_A6_XOR are two bits utilized to determine the output of ECC_A2 and ECC_A6. In many embodiments, the ECC_A2_XOR and ECC_A6_XOR bits are stored in a register that can be written to by the Basic Input/Output System (BIOS). In different embodiments, this register may be located in software, firmware, or hardware, the location of which may be external to the memory on the platform, within a hub controller, within a processor, within the AMB, or within each DIMM of memory. For example, in the embodiment shown in FIG. 4, the register (the XOR register 402 in FIG. 4) is located within the AMB.
MRS_CYCLE is an input bit that is logically high ("1") when an MRS cycle is the current memory operation and logically low ("0") when any cycle other than an MRS cycle is the current memory operation.

The ECC_A2_XOR and ECC_A6_XOR bits are separately AND'ed with the MRS_CYCLE bit. Thus, the ECC_A2_XOR and ECC_A6_XOR bits are always logically "0" for any non-MRS memory cycle. Whereas, during an MRS memory cycle, the ECC_A2_XOR and ECC_A6_XOR bits, which are written by the BIOS in many embodiments, are each potentially logically "0" or "1". During an MRS memory cycle, the ECC_A2_XOR and ECC_A6_XOR bits are each exclusive OR'd (XOR) with the A2 and A6 values respectively. The result of these two XOR logic operations generates the ECC_A2 and ECC_A6 values.

Importantly, during normal memory cycles (i.e. non-MRS cycles), ECC_A2=A2 and ECC_A6=A6. This assures that normal memory reads and writes target correct memory location(s). During an MRS cycle, the generated ECC_A2 and ECC_A6 can be equal to A2 and A6 respectively or they can be different values (e.g. both can be the same, one of them can be different and the other one the same, or both can be different than the respective A2 and A6 values). This depends on the values input into the ECC_A2_XOR and ECC_A6_XOR bits by the BIOS. In many embodiments, the BIOS leaves the ECC_A2_XOR and ECC_A6_XOR bit values at logical "0" until an MRS memory cycle happens. Then, the BIOS can potentially modify one or both of the ECC_A2_XOR and ECC_A6_XOR bits to change the ECC_A2 and ECC_A6 generated output above. In many embodiments, the BIOS may change the values of the ECC_A2_XOR and ECC_A6_XOR bits for each memory rank programmed. The entire set of possible results of the generated ECC_A2 and ECC_A6 values, based on the input A6, A2, ECC_A2_XOR, and ECC_A6_XOR values are shown in FIG. 5 below.

In some embodiments that utilize a Registered DIMM (RDIMM), the ODT-PLU 400 may be located within the Register device on the DIMM.

Although what is described above is specific to programming multiple ODT values using the ECC A6 and ECC A2, in some embodiments, other values (i.e. other than ODT values) that are located within the MR and the EMR1-3 registers may be programmed differently per memory rank or per DRAM device utilizing the ECC A6 and ECC A2, or additional ECC specific address signals as needed.

FIG. 5 describes one embodiment of the EMR(1) values for A6 and A2 and a subsequently ODT-PLU modified version of the ECC A6 and ECC A2 values. The address field 500 shows the input lines from the AMB to each of the DRAMs being comprised of bank address lines 2-0 and address lines A15-A0. When BA1 and BA0 point to EMR(1) (BA1=0 and BA0=1) in the EMRS programming mode, address bits A6 and A2 comprise the resistance value (Rtt) which is referred to as the ODT value. In the standard configuration, Rtt values are shown in the small Standard Rtt Values table 504. In many embodiments, after these values in A6 and A2 are sent through the ODT-PLU, the resulting values of the ECC A6 and ECC A2 are shown in the ECC Rtt Values table 506.

The generated ECC A6 and ECC A2 values from the original A6 and A2 values can be any combination based on the current values of ECC_A2_XOR and ECC_A6_XOR, as discussed above in regard to FIG. 4. The table of generated ECC A6 values based on the input from A6 and ECC_A6_XOR is shown at 508. The table of generated ECC A2 values based on the input from A2 and ECC_A2_XOR is shown at 510.

In some embodiments, when A6=1 and A2=0, to generally give the DRAM devices a 150Ω ODT resistance, the BIOS may require the ECC DRAM devices to have a 75Ω ODT resistance instead for each rank. Thus, during an MRS cycle for each rank, the BIOS may program ECC_A6_XOR with a "1" to generate ECC A6=0 from the A6=1 input and program ECC_A2_XOR with a "0" to generate ECC A2=1 from the A2=0 input. Again, by programming the XOR register bits this way, the ECC A6 and ECC A2 values would be the inverse of the A6 and A2 values, which leads to the different resistance value (as shown in the ECC Rtt values table 506).

Figure 6:
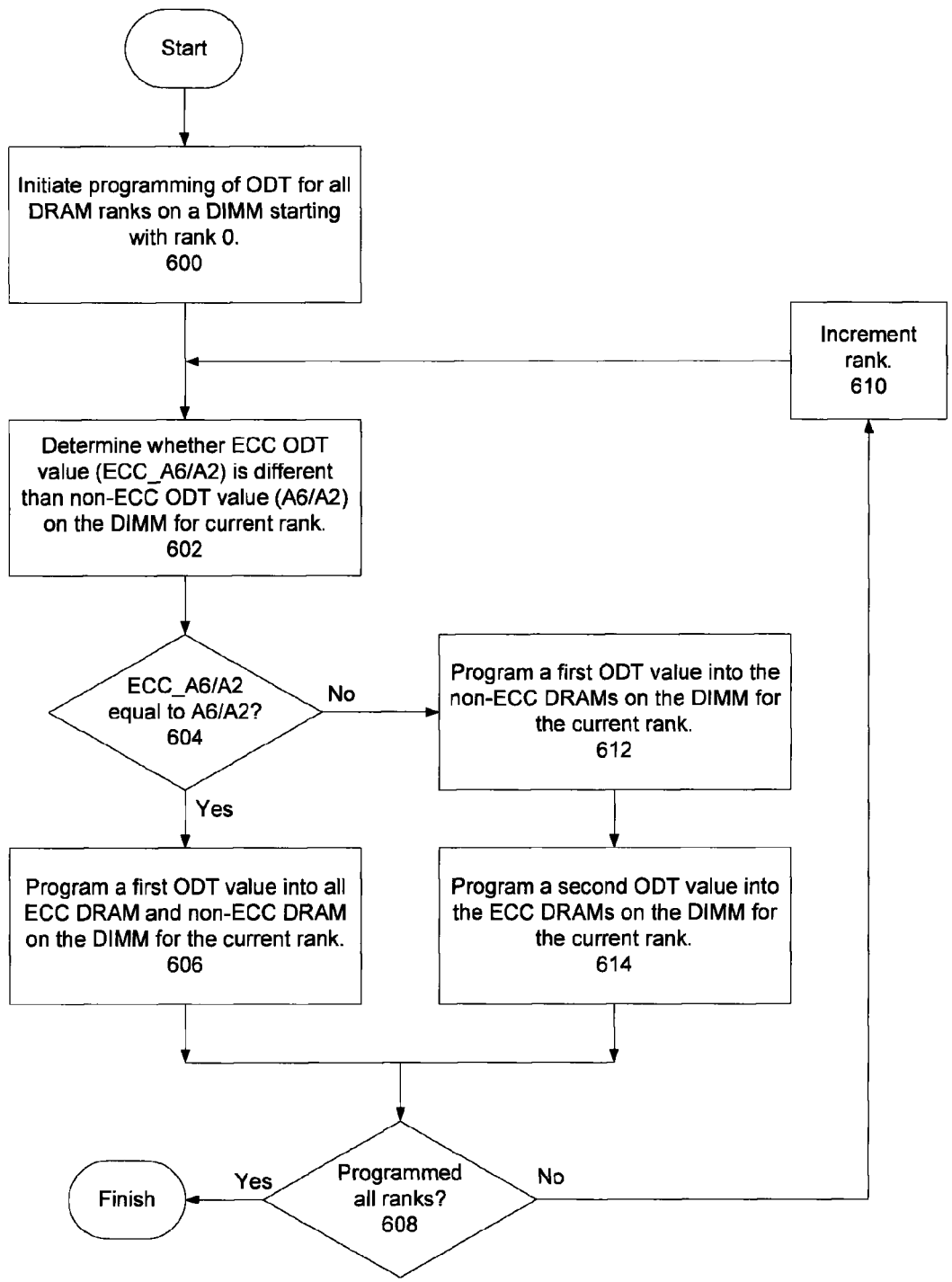
FIG. 6 is a flow diagram of one embodiment of a process to program a first ODT value into a non-ECC DRAM on a DIMM and program a second ODT value into an ECC DRAM on the DIMM.

FIG. 6 is a flow diagram of one embodiment of a process to program a first ODT value into a non-ECC DRAM on a DIMM and program a second ODT value into an ECC DRAM on the DIMM. The process is performed by processing logic that may comprise hardware (circuitry, dedicated logic, etc.), software (such as is run on a general purpose computer platform or a dedicated machine), or a combination of both. Referring to FIG. 6, the process begins by processing logic initiating the programming ODT for all DRAM ranks on a DIMM starting with rank 0 (processing block 600). In many embodiments, the DIMM is a fully buffered DIMM (FB-DIMM). In other embodiments, the DIMM is a Registered DIMM (RDIMM).

Next, processing logic determines whether the ECC ODT value (ECC A6/A2 as described in detail in relation to FIGS.

4 and 5) is to be a different value than the non-ECC ODT value (A6/A2) on the DIMM. (processing block 602). As discussed above, an ODT-PLU may determine if the A6 and A2 address lines are programmed for a 150Ω resistance. The processing flow branches based on the results of the determination (processing block 604). If, after determining the ECC A6/A2 value is the same as the A6/A2 value, then processing logic programs a first ODT value into all ECC DRAM and non-ECC DRAM devices on the DIMM for the current rank (processing block 606). Next, processing logic checks to see if all ranks have been programmed with this ODT value (processing block 608). In many embodiments, the DIMM being programmed is a quad ranked DIMM, thus processing block 606 must go through four iterations. Thus, if more ranks need to be programmed, then processing logic increments the rank (processing block 610) and returns to the program ODT processing block 606. Otherwise, if all ranks have been programmed, then the process is finished.

On the other hand, if the ECC_A6/A2 value is not the same as the A6/A2 value, then processing logic programs a first ODT value into all non-ECC DRAM devices on the DIMM for the current rank (processing block 612). Next processing logic programs a second ODT value into all ECC DRAM devices on the DIMM for the current rank (processing block 614). Next, processing logic checks to see if all ranks have been programmed with the two separate ODT values for ECC and non-ECC DRAM devices (processing block 616). If more ranks need to be programmed, then processing logic increments the rank (processing block 618) and returns to processing block 612. Otherwise, if all ranks have been programmed, then the process is finished.

Although the above description and figures utilize example embodiments of ECC devices being the DRAM devices located on the opposite side of the DIMM directly underneath the AMB, in many other embodiments, the ECC DRAM devices may not be directly underneath the AMB and rather other non-ECC DRAM devices are directly underneath the AMB. In these embodiments, the alternative ODT programming values through ECC A6/A2 can be utilized to program these non-ECC DRAM devices rather than ECC DRAM devices. In essence, any type and number of devices on a DIMM may be programmed with one ODT value and any type and number of other devices on the DIMM may be programmed with a second ODT value.

Thus, embodiments of a method, device, and system to program a first On-die Termination Value for a non-ECC DRAM on a DIMM and a second On-die Termination Value for an ECC DRAM on the DIMM are described. These embodiments have been described with reference to specific exemplary embodiments thereof. It will be evident to persons having the benefit of this disclosure that various modifications and changes may be made to these embodiments without departing from the broader spirit and scope of the embodiments described herein. The specification and drawings are, accordingly, to be regarded in an illustrative rather than a restrictive sense.

What is claimed is:

1. A method, comprising:
    programming a first On-Die Termination (ODT) value into a first plurality of dynamic random access memory (DRAM) devices on a dual inline memory module (DIMM); and
    programming a second ODT value into a second plurality of additional DRAM devices on the DIMM, wherein the first and second ODT values are not the same value;
    wherein the first ODT value is stored in an Extended Mode Register (EMR) on each of the DRAM devices comprising the first plurality of DRAM devices, and wherein the second ODT value is stored in an EMR on the each of the DRAM devices comprising the second plurality of additional DRAM devices; and
    wherein the first plurality of DRAM devices comprises a plurality of non-error checking and correction (non-ECC) DRAM devices and the second plurality of additional DRAM devices comprises a plurality of ECC DRAM devices.

2. The method of claim 1, further comprising:
    programming the first ODT value, wherein the first ODT value comprises a two-bit register value for each of the plurality of non-ECC DRAM devices;
    creating the second ODT two-bit register value by inverting the first ODT two-bit register value;
    programming the second ODT two-bit register value for each of the plurality of ECC DRAM devices.

3. The method of claim 1, further comprising programming at least one entire rank of non-ECC DRAM devices on the DIMM with the first ODT value.

4. The method of claim 1, further comprising programming all of the non-ECC DRAM devices on the DIMM with the first ODT value.

5. The method of claim 1, wherein the DIMM comprises a fully-buffered DIMM.

6. The method of claim 1, wherein the DIMM comprises a registered DIMM.

7. A device, comprising On Die Termination (ODT) programming logic to
    program a first ODT value into a first plurality of dynamic random access memory (DRAM) devices on a dual inline memory module (DIMM); and
    program a second ODT value into a second plurality of additional DRAM devices on the DIMM, wherein the first and second ODT values are not the same value;
    wherein the first ODT value is stored in an Extended Mode Register (EMR) on each of the DRAM devices comprising the first plurality of DRAM devices, and wherein the second ODT value is stored in an EMR on the each of the DRAM devices comprising the second plurality of additional DRAM devices; and
    wherein the first plurality of DRAM devices comprises a plurality of non-error checking and correction (non-ECC) DRAM devices and the second plurality of additional DRAM devices comprises a plurality of ECC DRAM devices.

8. The device of claim 7, wherein the DIMM comprises a fully-buffered DIMM, and wherein the DIMM comprises a printed circuit board, the ECC DRAM device being located directly on the opposite side of the printed circuit board from an Advanced Memory Buffer (AMB).

9. The device of claim 7, wherein the ODT programming logic is further operable to program at least one entire rank of non-ECC DRAM devices on the DIMM with the first ODT value.

10. The method of claim 9, wherein the ODT programming logic is further operable to program all of the non-ECC DRAM devices on the DIMM with the first ODT value.

11. A system, comprising:
    a fully-buffered dual inline memory module (DIMM);
    a first plurality of dynamic random access memory (DRAM) devices, coupled to the DIMM;
    a second plurality of additional DRAM devices, coupled to the DIMM;
    an Advanced Memory Buffer (AMB), coupled to the DIMM; and On Die Termination (ODT) programming logic, coupled to the DIMM, to program a first ODT value into each of the DRAM devices comprising the first plurality of DRAM devices; and program a second ODT value into each of the DRAM devices comprising the second plurality of additional DRAM devices, wherein the first and second ODT values are not the same value;

wherein the first ODT value is stored in an Extended Mode Register (EMR) on each of the DRAM devices comprising the first plurality of DRAM devices, and wherein the second ODT value is stored in an EMR on the each of the DRAM devices comprising the second plurality of additional DRAM devices; and wherein the first plurality of DRAM devices comprises a plurality of non-error checking and correction (non-ECC) DRAM devices and the second plurality of additional DRAM devices comprises a plurality of ECC DRAM devices.

12. The system of claim 11, wherein the DIMM comprises a printed circuit board, and wherein the plurality of ECC DRAM devices are located directly on the opposite side of the printed circuit board from the AMB.

13. The system of claim 11, wherein the ODT programming logic is further operable to program at least one entire rank of non-ECC DRAM devices on the DIMM with the first ODT value.

14. The system of claim 11, wherein the ODT programming logic is further operable to program all of the non-ECC DRAM devices on the DIMM with the first ODT value.

* * * * *